(12) United States Patent
Peng et al.

(10) Patent No.: US 10,837,993 B2
(45) Date of Patent: Nov. 17, 2020

(54) CIRCUIT AND METHOD FOR BANDWIDTH MEASUREMENT

(71) Applicant: TAIWAN SEMICONDUCTOR MANUFACTURING COMPANY, LTD., Hsinchu (TW)

(72) Inventors: Yung-Chow Peng, Hsinchu (TW); Chih-Chiang Chang, Taipei (TW); Wen-Shen Chou, Zhubei (TW); Brady Yang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 332 days.

(21) Appl. No.: 15/874,459

(22) Filed: Jan. 18, 2018

(65) Prior Publication Data

US 2018/0156855 A1 Jun. 7, 2018

Related U.S. Application Data

(62) Division of application No. 14/724,258, filed on May 28, 2015, now Pat. No. 9,921,254.

(60) Provisional application No. 62/011,295, filed on Jun. 12, 2014.

(51) Int. Cl.
*G01R 27/28* (2006.01)
*H03F 3/45* (2006.01)

(52) U.S. Cl.
CPC ......... *G01R 27/28* (2013.01); *H03F 3/45475* (2013.01); *H03F 2200/261* (2013.01); *H03F 2203/45514* (2013.01)

(58) Field of Classification Search
CPC ....... H03F 3/45475; H03F 2203/45514; H03F 2200/261; G01R 27/28
See application file for complete search history.

(56) References Cited

U.S. PATENT DOCUMENTS

| 7,161,428 B2 * | 1/2007 | Mendenhall | H03F 1/48 330/207 A |
| 9,921,254 B2 * | 3/2018 | Peng | G01R 27/28 |
| 2005/0242878 A1 | 11/2005 | Mendenhall | |

(Continued)

OTHER PUBLICATIONS

Chen, James C, et al., "An On-Chip, Attofarad Interconnect Charge-Based Capacitance Measurement (CBCM) Technique", 1996 IEEE, pp. 1-4.

*Primary Examiner* — Bryan Bui
(74) *Attorney, Agent, or Firm* — Hauptman Ham, LLP

(57) ABSTRACT

A circuit for measuring a bandwidth of an amplifier includes first and second capacitors, first through third switches, and a pulse generator. First terminals of the capacitors are coupled to an amplifier input, and a second terminal of the second capacitor is coupled to an amplifier output. The first switch has a control terminal and terminals coupled to a first input node and a second terminal of the first capacitor. The second switch has a control terminal and terminals coupled to the amplifier input and output. The third switch has a control terminal, a first terminal, and a second terminal coupled to the second terminal of the first capacitor. The pulse generator has a first output coupled to the control terminal of the third switch, and is configured to vary a pulse width of a pulse signal supplied from the first output to the control terminal of the third switch.

20 Claims, 11 Drawing Sheets

(56) References Cited

U.S. PATENT DOCUMENTS

2013/0049810 A1 2/2013 Lu et al.
2015/0362540 A1 12/2015 Peng et al.

* cited by examiner

CIRCUIT AND METHOD FOR BANDWIDTH MEASUREMENT

PRIORITY CLAIM

The instant application is divisional of U.S. application Ser. No. 14/724,258, filed May 28, 2015, now U.S. Pat. No. 9,921,254, which is a non-provisional application claiming the benefit of Provisional Application No. 62/011,295, filed Jun. 12, 2014, which are incorporated by reference herein in their entireties.

RELATED APPLICATIONS

The instant application is related to Provisional Application No. 62/011,310, filed Jun. 12, 2014. The entire content of Provisional Application No. 62/011,310 is incorporated by reference herein.

The instant application is also related to a non-provisional application Ser. No. 14/482,168, filed Sep. 10, 2014, now U.S. Pat. No. 10,161,977, claiming the benefit of Provisional Application No. 62/011,310. The entire content of non-provisional application Ser. No. 14/482,168, claiming the benefit of Provisional Application No. 62/011,310, is incorporated by reference herein.

BACKGROUND

Amplifiers, such as operational amplifiers, are used in various types of circuits. Among various parameters of an amplifier, bandwidth is a design consideration for not only the amplifier, but also other components in a circuit using the amplifier. Amplifier bandwidth measurements are performed to obtain data useful for design and/or manufacture improvements.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
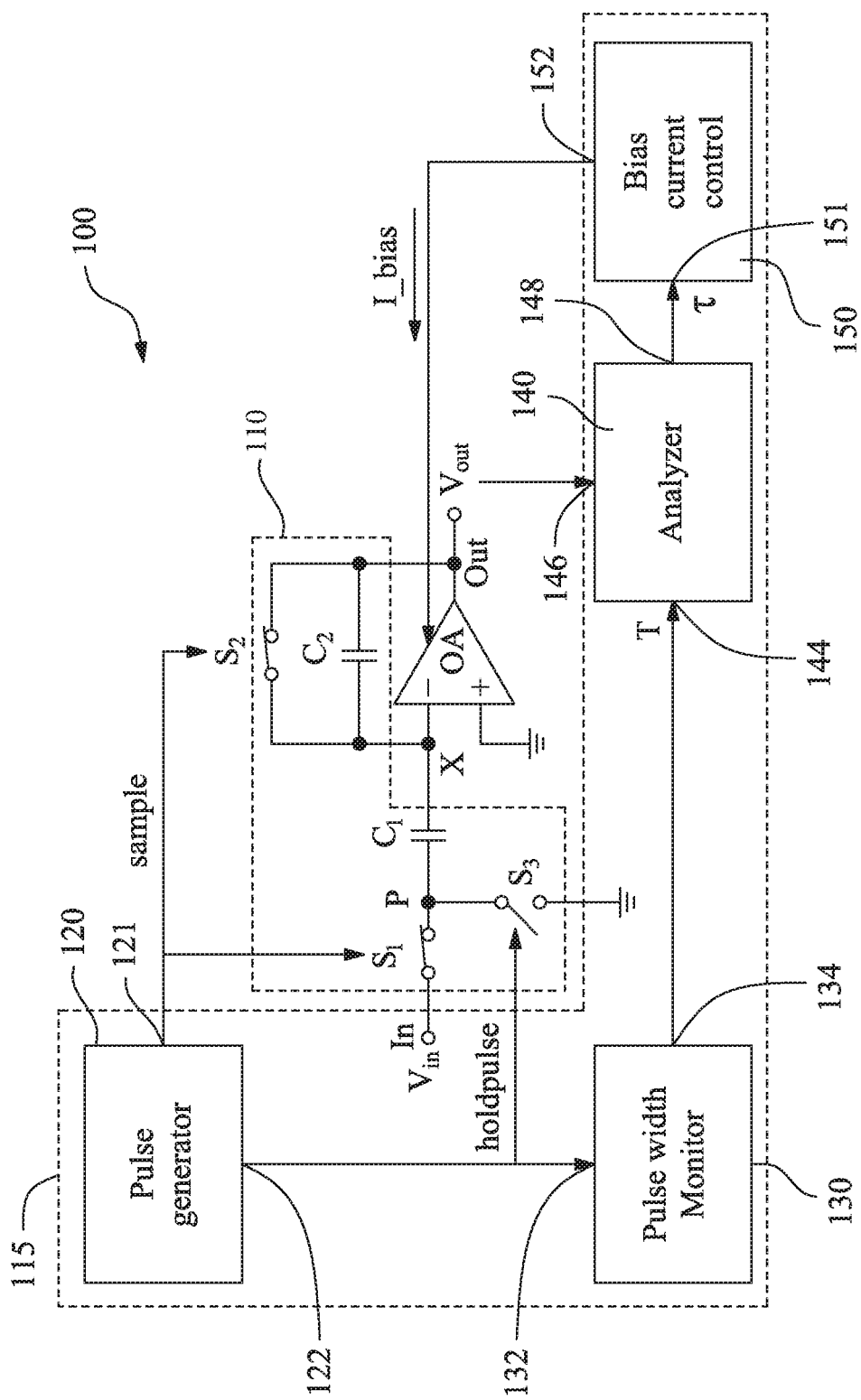
FIG. 1A is a schematic circuit diagram of a bandwidth measurement circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, when a first element is described as being "connected" or "coupled" to a second element, such description includes embodiments in which the first and second elements are directly connected or coupled to each other, and also includes embodiments in which the first and second elements are indirectly connected or coupled to each other with one or more other intervening elements in between.

FIG. 1A is a schematic circuit diagram of a bandwidth measurement circuit 100 in accordance with some embodiments. The bandwidth measurement circuit 100 comprises an input In, an output Out, an amplifier, e.g., an operational amplifier OA, a switch-capacitor circuit 110, and a controller 115. The controller 115 comprises a pulse generator 120, a pulse width monitor 130, an analyzer 140, and a bias current control circuit 150.

The operational amplifier OA has an inverting input coupled to a node X, a non-inverting input coupled to the ground, and an output coupled to the output Out. In some embodiments, the operational amplifier OA is a device under test (DUT). In at least one embodiment, the operational amplifier OA is an operational trans-conductance amplifier (OTA). In at least one embodiment, the OTA is a basic component for an analog design as a digital gate for a digital design. In at least one embodiment, the bandwidth of the OTA is one of various parameters to be characterized as early as possible, especially for high speed applications. The bandwidth determination methodology described herein with respect to one or more embodiments are applicable not only to OTAs, but also to other types of amplifiers.

The switch-capacitor circuit 110 comprises a first capacitor C1 and C2, and switches S1, S2 and S3. The capacitor C1 has one terminal coupled to the node X, and another terminal coupled to a node P. The terminals of the capacitor C1 are referred to herein as terminals X and P. The capacitor C2 one terminal coupled to the terminal X of the capacitor C1, and another terminal coupled to the output Out. The switch S1 has one terminal coupled to the terminal P of the capacitor C1, and another terminal coupled to the input In. The switch S1 further has a control terminal coupled to the pulse generator 120 to receive from the pulse generator 120 a signal sample which controls the switch S1 to close or open. The switch S2 has one terminal coupled to the terminal P of the capacitor C1, and another terminal coupled to the output Out. The switch S2 further has a control terminal coupled to the pulse generator 120 to receive from the pulse generator 120 a signal sample which controls the switch S2 to close or open. The switch S3 has one terminal coupled to the terminal P of the capacitor C1, and another terminal coupled to a node of a reference voltage, such as the ground. Reference voltages other than the ground voltage are within the scope of various embodiments. The switch S3 further has a control terminal coupled to the pulse generator 120 to receive from the pulse generator 120 a signal holdpulse which controls the switch S3 to close or open. In at least one embodiment, one or more of the switches S1-S3 includes a transistor. Examples of transistors include, but are not limited to, n-channel metal-oxide semiconductor (NMOS) and p-channel metal-oxide semiconductor (PMOS) transistors. Other switching arrangements are within the scope of various embodiments. The described configuration of the switch-capacitor circuit 110 is an example. Other arrangements are within the scope of various embodiments.

The pulse generator 120 has outputs 121 and 122. The output 121 is coupled to the control terminals of the switch S1 and switch S2 to output the signal sample to control the switch S1 and switch S2. The output 122 is coupled to the control terminal of the switch S3 to output the signal holdpulse to control the switch S3. In at least one embodiment, the pulse generator 120 is implemented as two pulse generators, one configured to generate the signal sample, and the other configured to generate the signal holdpulse. An example configuration of the pulse generator 120 is described with respect to FIG. 3. The signal sample and the signal holdpulse are generated by the pulse generator 120 to switch the switch-capacitor circuit 110 between a sampling mode and an amplification mode as described herein. A pulse width of the signal holdpulse is varied by the pulse generator 120 to control a duration of the amplification mode as described herein.

The pulse width monitor 130 has an input 132 and an output 134. The input 132 is coupled to the output 122 of the pulse generator 120 to receive the signal holdpulse from the pulse generator 120. The pulse width monitor 130 is configured to monitor the pulse width of the signal holdpulse, and output a signal T corresponding to the monitored pulse width at the output 134. In at least one embodiment, the pulse width monitor 130 is omitted or incorporated in the analyzer 140. In at least one embodiment, the pulse width monitor 130 includes a time-to-current converter (TCC). One or more example TCC configurations are described in U.S. Patent Application Publication No. 2013/0049810 which is incorporated by reference in its entirety herein. Other arrangements are within the scope of various embodiments.

The analyzer 140 has inputs 144 and 146, and an output 148. The input 144 is coupled to the output 134 of the pulse width monitor 130 to receive the signal T, and the input 146 is coupled to the output Out to receive an output voltage Vout at the output Out. The analyzer 140 is configured to determine a bandwidth of the operational amplifier OA based on the signal T and the output voltage Vout, and output a signal (e.g., a time constant $\tau$) corresponding to the determined bandwidth at the output 148. In at least one embodiment, the bandwidth of the operational amplifier OA is the highest operational frequency of the operational amplifier OA, and is determined as $1/\tau$. In at least one embodiment, the analyzer 140 comprises one or more of a processor, a central processing unit (CPU), a multi-processor, a distributed processing system, an application specific integrated circuit (ASIC), and a suitable processing unit.

The bias current control circuit 150 has an input 151 and an output 152. The input 151 is coupled to the output 148 of the analyzer 140 to receive the signal corresponding to the determined bandwidth of the operational amplifier OA. The output 152 is coupled to a bias current receiving node of the operational amplifier OA. Based on the received determined bandwidth, the bias current control circuit 150 is configured to output a bias current I_bias to the operational amplifier OA to adjust the bandwidth of the operational amplifier OA to meet a predetermined specification or a command from another controlling circuitry. For example, when the determined bandwidth is lower than an intended value, the bias current I_bias is increased to increase the bandwidth of the operational amplifier OA. When the determined bandwidth is higher than the intended value, the bias current I_bias is decreased to reduce the bandwidth of the operational amplifier OA. An example bias current control circuit is described with respect to FIG. 8.

In some embodiments, the controller 115 further comprises a charge-based capacitance measurement (CBCM) circuit configured to measure capacitive load in the switch-capacitor circuit 110. An example of a CBCM circuit is described in J. Kopanski, M. Afridi, "Charge-Based Capacitance Measurements Circuits for Interface With Atomic Force Microscope Probes," 2013 International Conference on Frontiers of Characterization and Metrology for Nanoelectronics, pp. 287-289, Mar. 25-28, 2013, the entire content of which is incorporated by reference herein.

The described configuration of the controller 115 is an example. Other configurations are within the scope of various embodiments. For example, in some embodiments, one or more of the described components of the controller 115, i.e., the pulse generator 120, pulse width monitor 130, analyzer 140, bias current control circuit 150 and CBCM circuit, is/are omitted. In some embodiments, the controller 115 is arranged on-chip, e.g., on the same die or integrated circuit (IC) as the operational amplifier OA and the switch-capacitor circuit 110. This on-chip arrangement, in one or more embodiments, provides not only a testing capability during manufacture, but also an on-chip calibration and/or adjustment capability during operation. In some embodiments, one or more of the described components of the controller 115 is/are arranged off-chip, e.g., in automatic testing equipment.

Figure 1B:
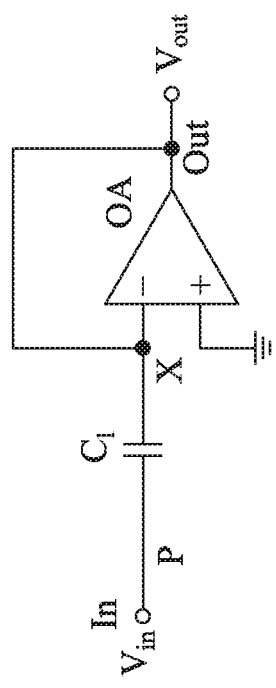
FIG. 1B is a schematic diagram of a part of the bandwidth measurement circuit of FIG. 1A in a sampling mode, in accordance with some embodiments.

FIG. 1B is a schematic diagram of the switch-capacitor circuit 110 and the operational amplifier OA of the bandwidth measurement circuit 100 of FIG. 1A in a sampling mode, in accordance with some embodiments. In the sampling mode, the switch S1 and switch S2 are closed, and the switch S3 is opened. For example, the signal sample has a logic high level that closes the switches S1 and S2, and the signal holdpulse has a logic low level that opens the switch S3. For simplicity, the capacitor C2 and switches S1, S2 and S3 are not illustrated in FIG. 1B. The opened switch S3 isolates the terminal P of the capacitor C1 from the ground. The input In is coupled via the closed switch S1 to the terminal P of the capacitor C1. The closed switch S2 short-circuits the terminal X of the capacitor C1 to the output Out. An input voltage Vin at the input In charges the capacitor C1 to a value Vin0 of the input voltage Vin. The output voltage Vout is at the ground voltage, i.e., zero. In some embodiments, Vin0 is a power supply voltage also referred to herein as VDD.

Figure 1D:
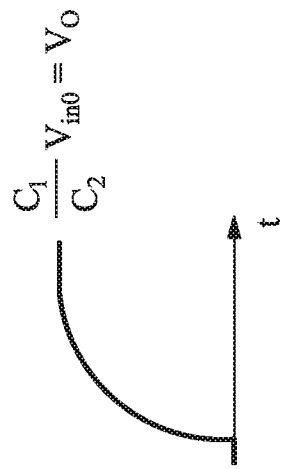
FIG. 1D is a time diagram of an output voltage of the bandwidth measurement circuit of FIG. 1A during a transition from the sampling mode to the amplification mode, in accordance with some embodiments.
Figure 1C:
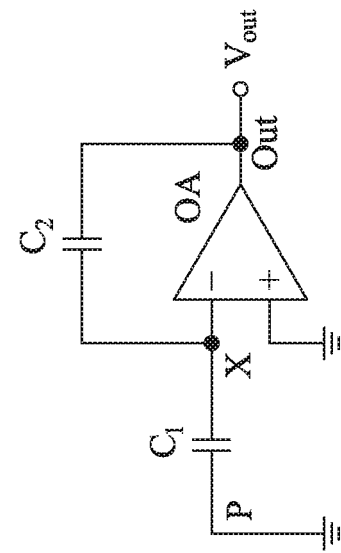
FIG. 1C is a schematic diagram of a part of the bandwidth measurement circuit of FIG. 1A in an amplification mode, in accordance with some embodiments.
Figure 1C:
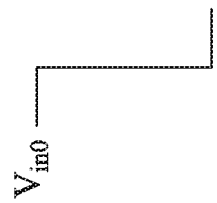

FIG. 1C is a schematic diagram of the switch-capacitor circuit 110 and the operational amplifier OA of the bandwidth measurement circuit 100 of FIG. 1A in an amplification mode, in accordance with some embodiments. In the amplification mode, the switch S1 and switch S2 are opened, and the switch S3 is closed. For example, the signal sample has a logic low level that opens the switches S1 and S2, and the signal holdpulse has a logic high level that closes the switch S3. For simplicity, the switches S1, S2 and S3 are not illustrated in FIG. 1C. The opened switch S1 isolates the input In from the terminal P of the capacitor C1. A reference voltage, such as the ground voltage, is applied via the closed switch S3 to the terminal P of the capacitor C1 during a period corresponding to the pulse width of the signal holdpulse. The capacitor C2 is coupled between the terminal X of the capacitor C1 and the output Out. The voltage on the terminal P of the capacitor C1 drops from Vin0 to zero as illustrated in FIG. 1C. The charge accumulated in the capacitor C1 during the sampling mode is transferred to the capacitor C2 and causes the output voltage Vout to rise.

FIG. 1D is a time diagram of the output voltage Vout during the transition from the sampling mode to the amplification mode, in accordance with some embodiments. During the transition, the output voltage Vout rises from zero to (Vin0*C1/C2). The rate of how fast the output voltage Vout rises from zero to the (Vin0*C1/C2) depends on a time constant τ which, in turn, depends on the ratio C1/C2 of the capacitances of the capacitor C1 and capacitor C2. In at least one embodiment, by determining the time constant τ, the bandwidth to be measured is determined.

Figure 2:
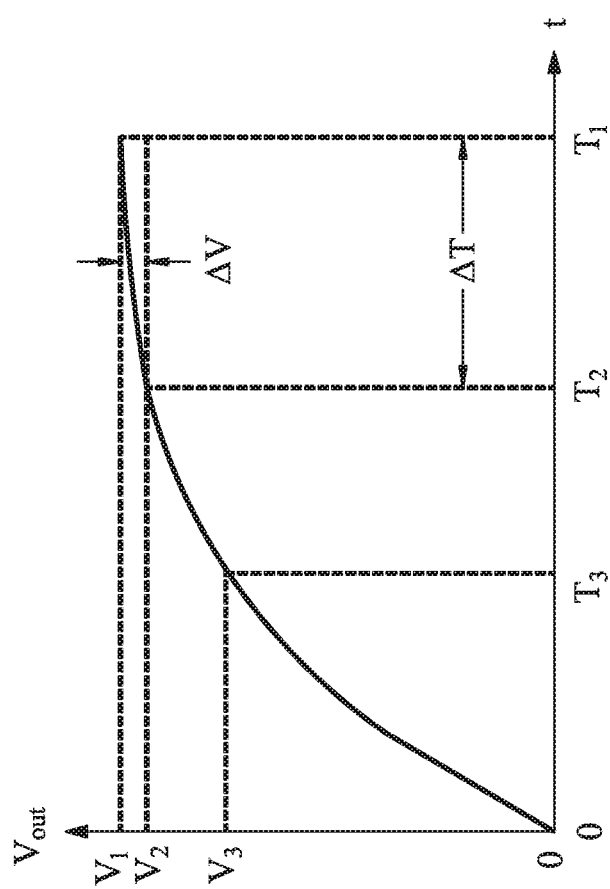
FIG. 2 is a time diagram similar to the time diagram of FIG. 1D, for explaining a bandwidth determination methodology, in accordance with some embodiments.

FIG. 2 is a time diagram similar to the time diagram of FIG. 1D, for explaining a bandwidth determination methodology, in accordance with some embodiments. A relationship between the output voltage Vout and the pulse width T of the signal holdpulse is determined by the following equation (1):

$$Vout = V_O * (1 - e^{-T/\tau}) \quad (1)$$

where $V_O$ is Vin0*C1/C2, and τ is the time constant corresponding to the bandwidth to be measured.

At various pulse widths T1, T2 and T3 of the signal holdpulse, the output voltage Vout rises to corresponding voltages V1, V2 and V3 which are held by the operational amplifier OA at the end of the duration of the amplification mode, i.e., at the trailing edge of the signal holdpulse. The voltages V1, V2 and V3 are measured by the analyzer 140. The greater the pulse width of the signal holdpulse, the higher the output voltage Vout. As the pulse width of the signal holdpulse increases, the output voltage Vout approaches Vin0*C1/C2. The relationships between the voltages V1, V2 and V3 and the corresponding pulse widths T1, T2 and T3 are determined by the following corresponding equations (2), (3) and (4):

$$V1 = V_O * (1 - e^{-T1/\tau}) \quad (2)$$

$$V2 = V_O * (1 - e^{-T2/\tau}) \quad (3)$$

$$V3 = V_O * (1 - e^{-T3/\tau}) \quad (4)$$

In at least one embodiment, the time constant τ is determined from the following equation (5):

$$\frac{\Delta V_{13}}{\Delta V_{23}} = \frac{1 - e^{-\Delta T_{13}/\tau}}{1 - e^{-\Delta T_{23}/\tau}} \quad (5)$$

where $\Delta V_{13}$=V1-V3, $\Delta V_{23}$=V2-V3, $\Delta T_{13}$=T1-T3, and $\Delta T_{23}$=T2-T3.

In some embodiments, the pulse widths T1, T2 and T3 are obtained by the pulse width monitor 130, and supplied to the analyzer 140. The analyzer 140 obtains the corresponding voltages V1, V2 and V3 from the output Out. Based on the obtained pulse widths T1, T2 and T3, and the obtained voltages V1, V2 and V3, the time constant τ is determined from resolving the equation (5). In some embodiments, for obtaining an accurate value of τ, the pulse widths T1, T2 and T3 are selected such that the voltages V1, V2 and V3 fall within a predetermined range of target voltages. An example range of target voltages is from 80% to 99% of $V_O$. For example, the target voltages of V1, V2 and V3 are equal to 99%, 90% and 80% of $V_O$, respectively. The described target range and/or target voltages are example. Other arrangements are within the scope of various embodiments. The bandwidth of the operational amplifier OA is determined as 1/τ. In some embodiments, the determination of τ corresponds to the determination of the bandwidth of the operational amplifier OA.

Figure 3:
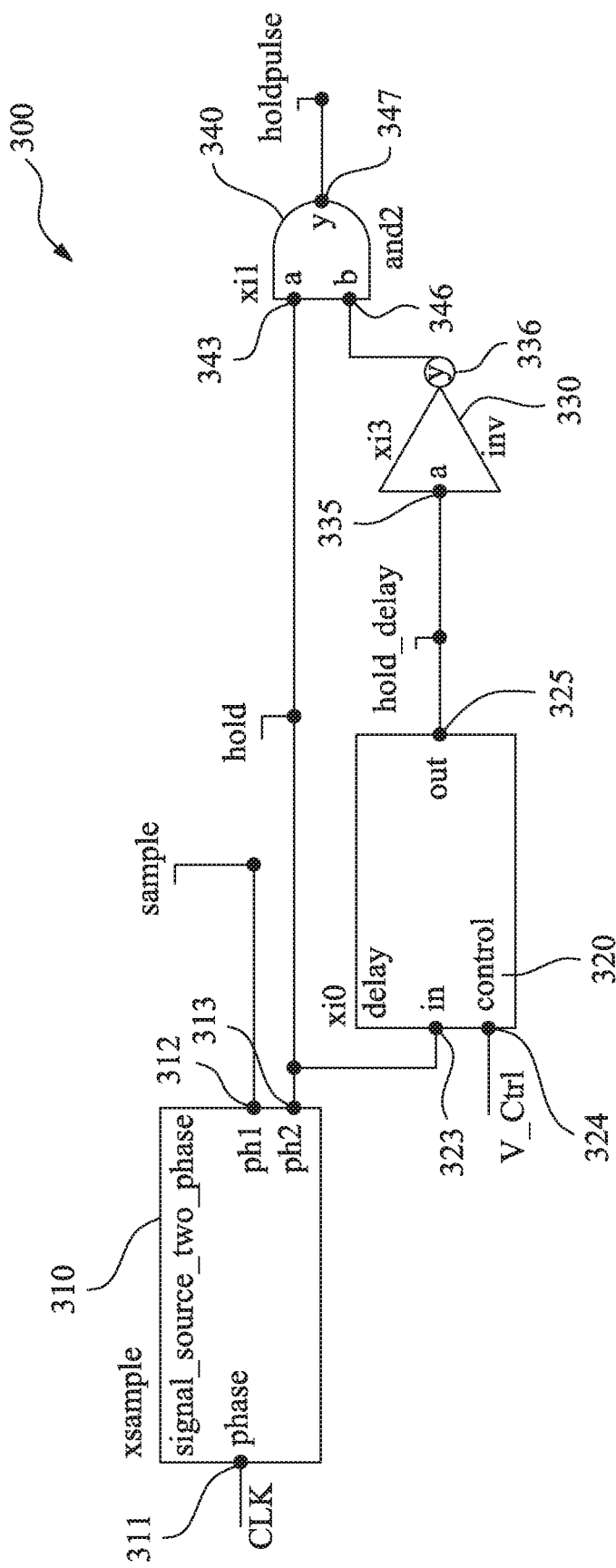
FIG. 3 is a schematic circuit diagram of a pulse generator, in accordance with some embodiments.

FIG. 3 is a schematic circuit diagram of a pulse generator 300, in accordance with some embodiments. The pulse generator 300 comprises a signal source 310 (xsample), an adjustable delay circuit 320 (xi0), an inverter 330, and an AND gate 340. In some embodiments, the pulse generator 300 corresponds to the pulse generator 120 described with respect to FIG. 1A.

The signal source 310 has an input 311 (phase) and two outputs 312, 313 (ph1, ph2). The input 311 is configured to receive a clock signal CLK. The outputs 312, 313 are configured to output corresponding signal sample and signal hold having different phases. In at least one embodiment, the signal sample and the signal hold have opposite phases. An example circuit of the signal source 310 is described with respect to FIG. 4C.

The adjustable delay circuit 320 has an input 323 (in), a control terminal 324 (control), and an output 325 (out). The input 323 is coupled to the output 313 of the signal source 310 to receive the signal hold. The control terminal 324 is configured to receive a control signal V_Ctrl for varying a delay of a signal hold_delay outputted at the output 325 with respect to the signal hold received at the input 323. Example configurations of the adjustable delay circuit 320 are described with respect to FIG. 4A and FIG. 4D.

The inverter 330 has an input 335 (a) and an output 336 (y). The input 335 is coupled to the output 325 of the adjustable delay circuit 320 to receive the signal hold_delay. The inverter 330 is configured to invert the signal hold_delay and output an inverted signal of the signal hold_delay at the output 336.

The AND gate 340 has inputs 343 (a), 346 (b) and an output 347 (y). The input 343 is coupled to the output 313 of the signal source 310 to receive the signal hold. The input 346 is coupled to the output 336 to receive the inverted signal of the signal hold_delay. The AND gate 340 is configured to output the signal holdpulse at the output 347.

The described configuration of the pulse generator 300 is an example. Other arrangements are within the scope of various embodiments.

Figure 4A:
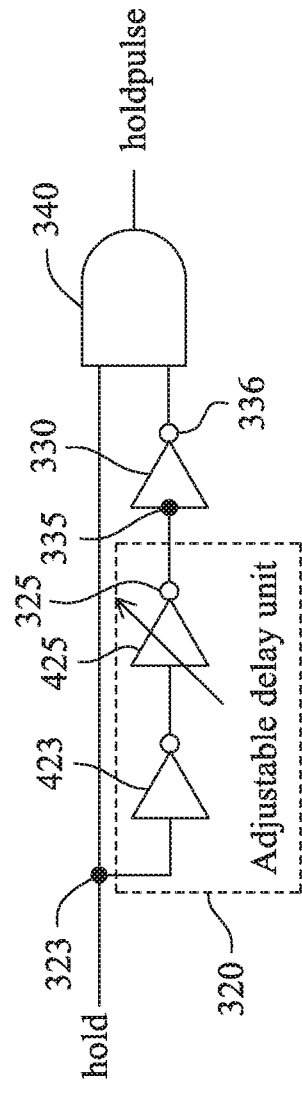
FIG. 4A is a schematic circuit diagram of a part of a pulse generator, in accordance with some embodiments.

FIG. 4A is a schematic circuit diagram of a part of the pulse generator 300 having the adjustable delay circuit 320, in accordance with some embodiments. In some embodiments, the adjustable delay circuit 320 is a gate-delay-type pulse width generator. The adjustable delay circuit 320 comprises an inverter 423 and an adjustable delay unit 425 coupled in series between the input 323 and the output 325. A delay setting of the adjustable delay unit 425 is adjustable in accordance with a control signal, such as the control signal V_Ctrl described with respect to FIG. 3. The described configuration of the adjustable delay circuit 320 is an example. Other arrangements are within the scope of various embodiments.

Figure 4B:
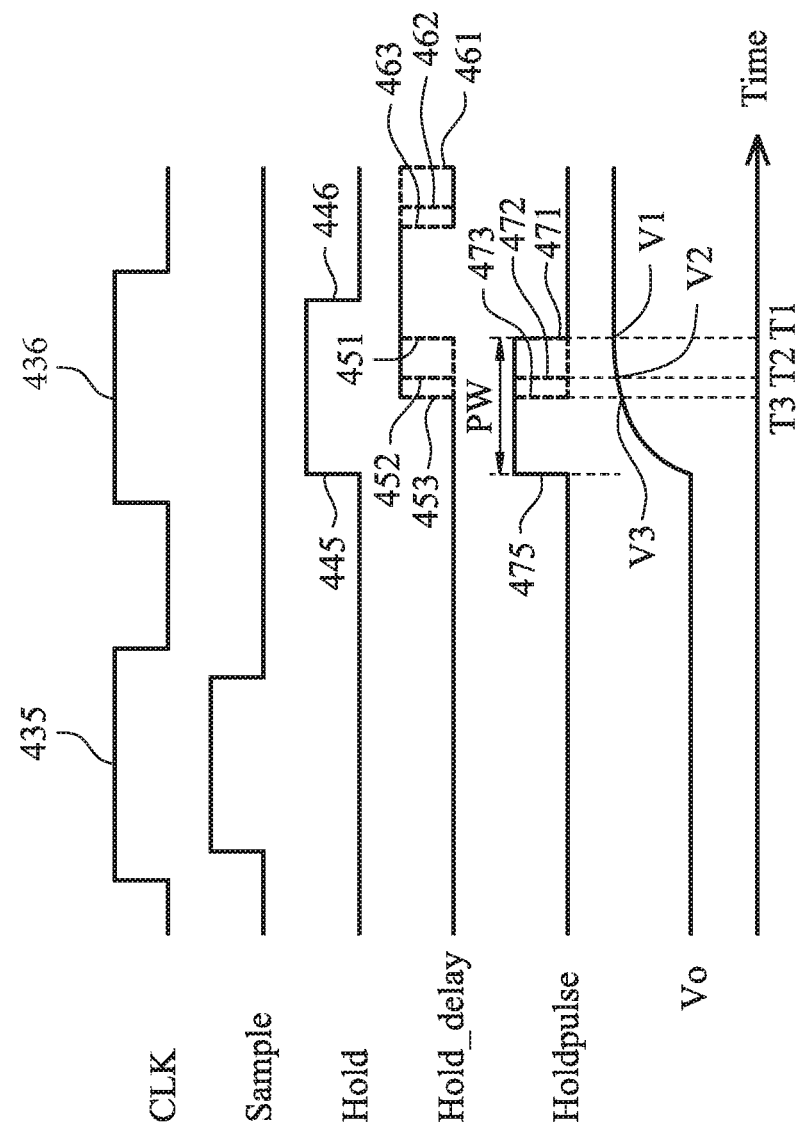
FIG. 4B is a time diagram of an operation of a pulse generator, in accordance with some embodiments.

FIG. 4B is a time diagram of an operation of the pulse generator 300, in accordance with some embodiments. As illustrated in FIG. 4B, the clock signal CLK is received by the signal source 310 which generates the signal hold and signal sample based on the received clock signal CLK. In the example configuration described with respect to FIG. 4B, the signal sample is generated based on a first pulse 435 of the clock signal CLK, and the signal hold is generated based on a subsequent, second pulse 436 of the clock signal CLK. In at least one embodiment, the signal sample and the signal hold have the same pulse width and a phase difference of 180 degrees. The signal hold is received by the adjustable delay circuit 320 which has a variable delay setting for delaying the received signal hold by an adjustable time period to generate the signal hold_delay. Specifically, the signal hold is inverted and delayed/inverted by the adjustable delay circuit 320 to generate the signal hold_delay. The signal hold_delay is then inverted again by the inverter 330 before being inputted together with the signal hold to the inputs of the AND gate 340. The AND gate 340 outputs the signal holdpulse having a pulse width PW corresponding to the delay between the signal hold and the signal hold_delay. The greater the delay caused by the adjustable delay unit 425, the larger (wider) the pulse width PW of the signal holdpulse. By varying the delay settings of the adjustable delay unit 425, the pulse width PW of the signal holdpulse is varied to generate various signals holdpulse of various pulse widths (such as T1, T2, T3) which cause the output voltage Vout to have corresponding various voltages (such as V1, V2, V3). As a result, the time constant τ corresponding to the bandwidth to be measured is obtainable, as described with respect to FIG. 2.

For example, in accordance with a first delay setting, the adjustable delay circuit 320 delays a rising edge 445 and a falling edge 446 of the signal hold to generate the signal hold_delay having a rising edge 451 and a falling edge 461. The signal hold_delay is supplied via the inverter 330 to the AND gate 340 which also receives the signal hold. The AND gate 340 performs an AND operation on the received signals and output the signal holdpulse having a rising edge 475 and a falling edge 471. The rising edge 475 corresponds to the rising edge 445 of the signal hold, and the falling edge 471 corresponds to the rising edge 451 of the signal hold_delay. The pulse width PW of the signal holdpulse corresponds to the first delay setting of the adjustable delay circuit 320, and has a pulse width value T1 as described herein. In accordance with a second delay setting, the adjustable delay circuit 320 generates the signal hold_delay having a rising edge 452 and a falling edge 462, the AND gate 340 outputs the signal holdpulse having the rising edge 475 and a falling edge 472 corresponding to the rising edge 452 of the signal hold_delay, and the pulse width PW of the signal holdpulse has a pulse width value T2 as described herein. In accordance with a third delay setting, the adjustable delay circuit 320 generates the signal hold_delay having a rising edge 453 and a falling edge 463, the AND gate 340 outputs the signal holdpulse having the rising edge 475 and a falling edge 473 corresponding to the rising edge 453 of the signal hold_delay, and the pulse width PW of the signal holdpulse has a pulse width value T3 as described herein. Accordingly, by varying the delay setting of the adjustable delay unit 425 in the adjustable delay circuit 320, the pulse width of the signal holdpulse is adjusted. The described operation of the adjustable delay circuit 320 is an example. Other arrangements are within the scope of various embodiments.

Figure 4C:
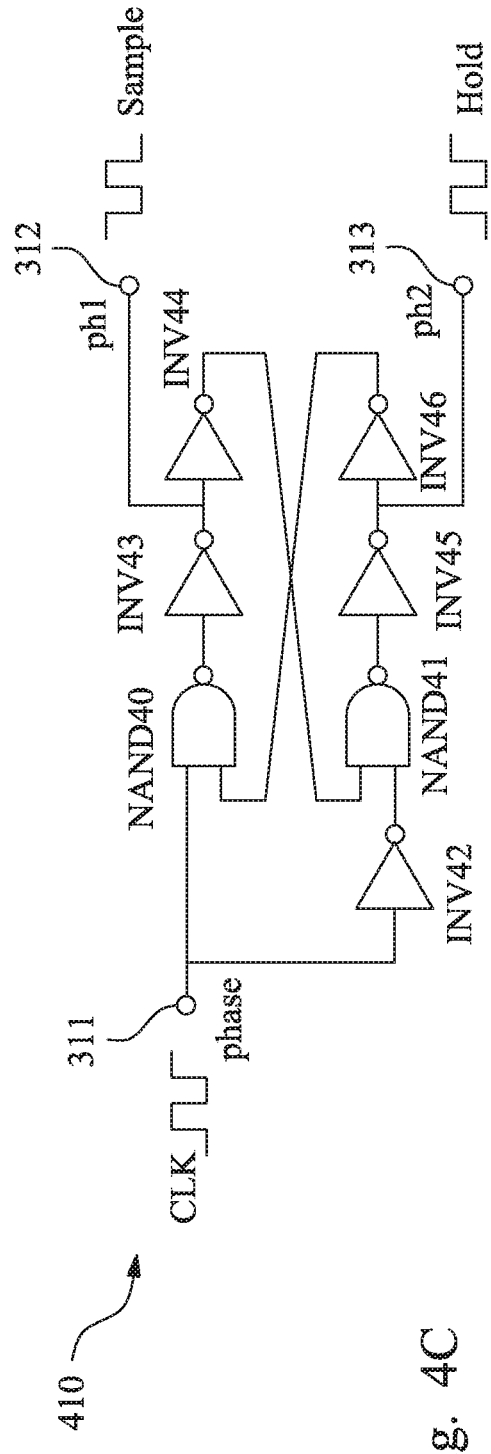
FIG. 4C is a schematic circuit diagram of a signal source in a pulse generator, in accordance with some embodiments.

FIG. 4C is a schematic circuit diagram of a signal source 410 in a pulse generator, in accordance with some embodiments. In at least one embodiment, the signal source 410 corresponds to the signal source 310 described with respect to FIG. 3. The signal source 410 comprises NAND gates NAND40, NAND41, and inverters INV42, INV43, INV44, INV45, and INV46. The NAND gate NAND40 and the inverters INV43 and INV44 are serially coupled in the described order. The inverter INV42, the NAND gate NAND41 and the inverters INV45 and INV46 are serially coupled in the described order. The output of the inverter INV46 is coupled to an input of the NAND gate NAND40, and another input of the NAND gate NAND40 is coupled to the input 311 (phase) to receive the clock signal CLK. The output of the inverter INV44 is coupled to an input of the NAND gate NAND41, and another input of the NAND gate NAND41 is coupled to the input 311 (phase) via the inverter INV42 to receive the clock signal CLK. The output of the inverter INV43 is coupled to the output 312 (ph1) to output the signal sample. The output of the inverter INV45 is coupled to the output 313 (ph2) to output the signal hold. The described configuration for a signal source is an example. Other arrangements are within the scope of various embodiments.

Figure 4D:
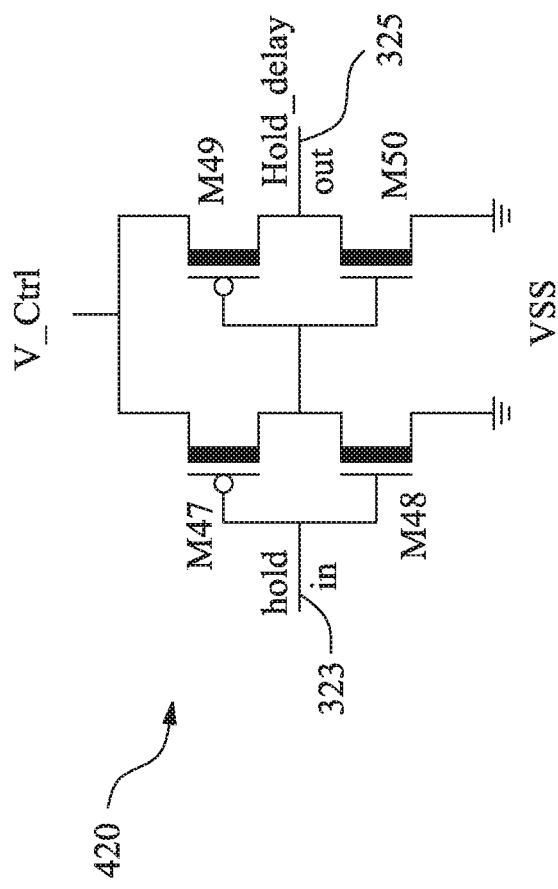
FIG. 4D is a schematic circuit diagram of an adjustable delay circuit in a pulse generator, in accordance with some embodiments.

FIG. 4D is a schematic circuit diagram of an adjustable delay circuit 420 in a pulse generator, in accordance with some embodiments. In at least one embodiment, the signal source 420 corresponds to the signal source 320 described with respect to FIG. 3. The adjustable delay circuit 420 comprises transistors M47, M48, M49, and M50. In at least one embodiment, the transistors M47 and M49 are PMOS transistors, and the transistors M48 and M50 are NMOS transistors. The transistors M47 and M48 are serially coupled between a node for receiving the control signal V_Ctrl and a node for receiving a voltage VSS, e.g., the ground voltage. Gates of the transistors M47 and M48 are coupled together and to the input 323 (in) to receive the signal hold. The transistors M49 and M50 are serially coupled between the node for receiving the control signal V_Ctrl and the node for receiving the voltage VSS. Gates of the transistors M49 and M50 are coupled together and to drains of the transistors M47 and M48. Drains of the transistors M49 and M50 are coupled to the output 325 (out). By varying the control signal V_Ctrl, the delay between the signal hold and the signal hold_delay is adjusted. For example, when the control signal V_Ctrl is increased, the delay becomes longer. When the control signal V_Ctrl is decreased, the delay becomes shorter. The described configuration for an adjustable delay circuit is an example. Other arrangements are within the scope of various embodiments.

Figure 5:
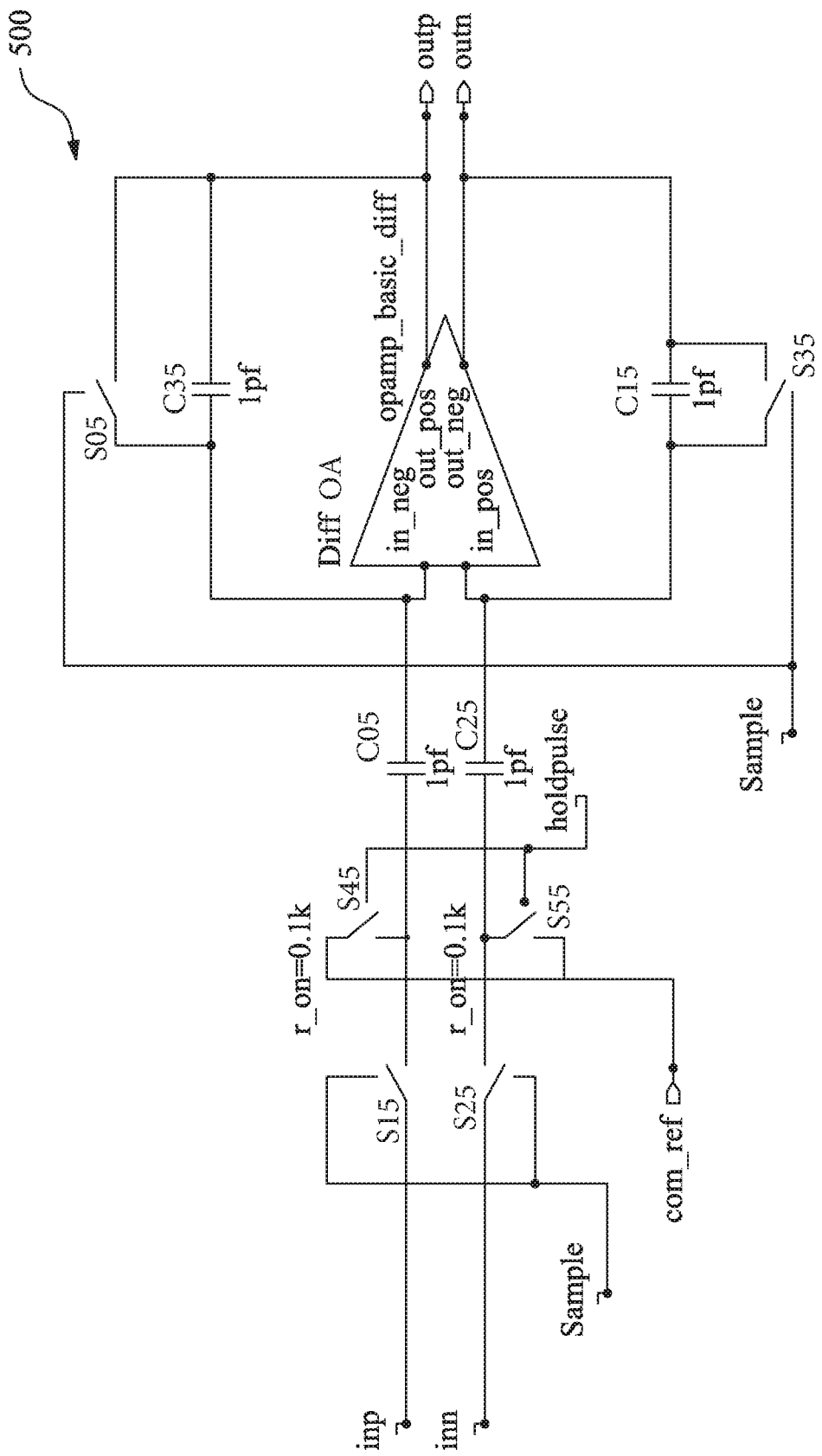
FIG. 5 is a schematic circuit diagram of a bandwidth measurement circuit, in accordance with some embodiments.

FIG. 5 is a schematic circuit diagram of a bandwidth measurement circuit 500, in accordance with some embodiments. The bandwidth measurement circuit 500 comprises a differential operational amplifier Diff OA, and a switch-capacitor circuit. The switch-capacitor circuit comprises switches S05, S15, S25, S35, S45 and S55, and capacitors C05, C15, C25 and C35. The bandwidth measurement circuit 500 further comprises differential inputs inp and inn, and differential outputs outp and outn. The switches S05, S15, S25, and S35 are controlled by the signal sample. The switches S45 and S55 are controlled by the signal holdpulse. A signal com_ref is coupled to one terminal of each of the switches S45 and S55. The input inp, the switch S15, the switch S45, the signal com_ref, the capacitor C05, an inverting input of the operational amplifier Diff OA, the capacitor C35, the switch S05 and the output outp correspond to, and are coupled together in the same manner as, the input In, the switch S1, the switch S3, the ground, the capacitor C1, the inverting input of the operational amplifier OA, the capacitor C2, the switch S2 and the output Out described with respect to FIG. 1A. The input inn, the switch S25, the switch S55, the signal com_ref, the capacitor C25, a non-inverting input of the operational amplifier Diff OA, the capacitor C15, the switch S35 and the output outn are coupled together in a similar manner to that described with respect to the input In, the switch S1, the switch S3, the ground, the capacitor C1, the inverting input of the operational amplifier OA, the capacitor C2, the switch S2 and the output Out described with respect to FIG. 1A. In at least one embodiment, the bandwidth measurement circuit 500 operates in a manner similar to that described with respect to FIGS. 1A-1D, and FIG. 2. The described configuration and/or operation of the bandwidth measurement circuit 500 is an example. Other arrangements are within the scope of various embodiments.

Figure 6A:
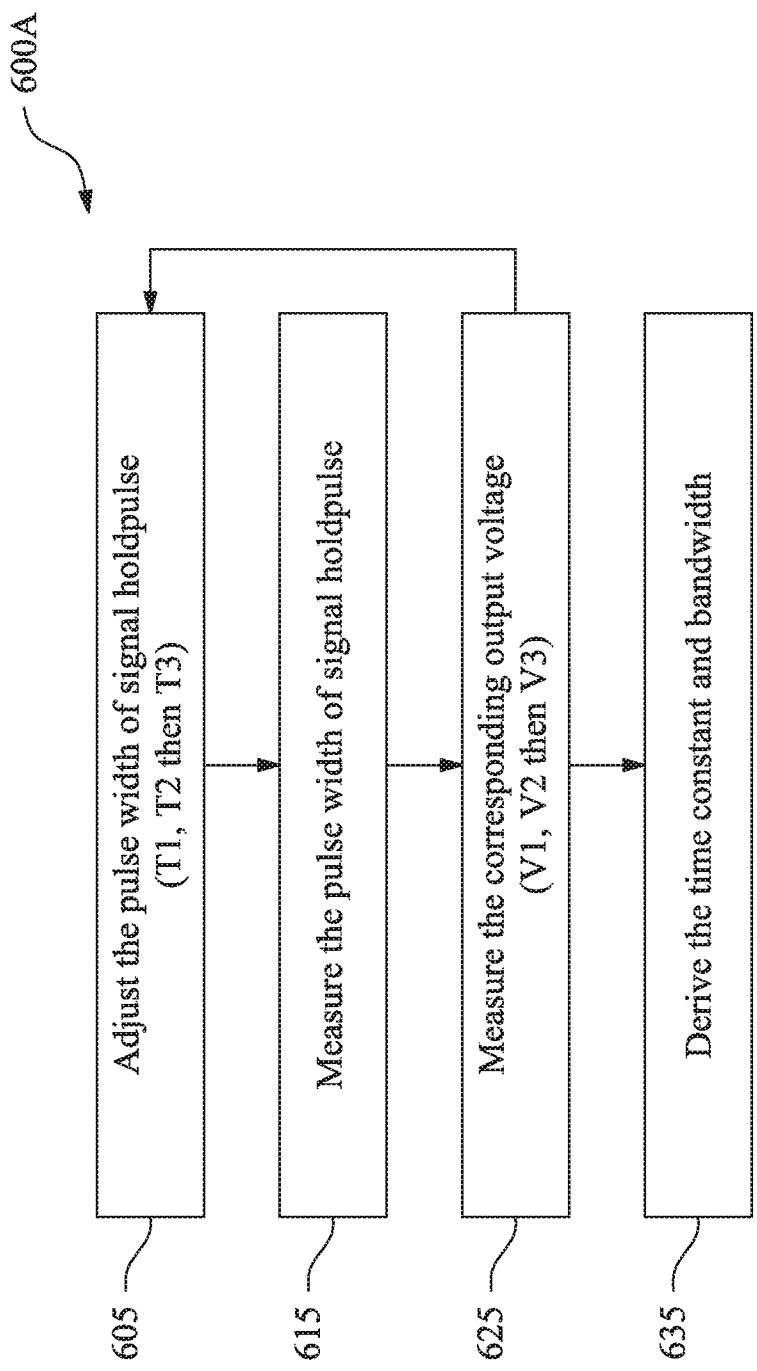
FIG. 6A is a flow chart of a method of bandwidth measurement, in accordance with some embodiments.

FIG. 6A is a flow chart of a method 600A of bandwidth measurement, in accordance with some embodiments. In at least one embodiment, the method 600A is performed by one or more of the bandwidth measurement circuits described herein, under control of a controller, e.g., the controller 115 described herein.

At operation 605, the pulse width of the signal holdpulse is adjusted. For example, the pulse width of the signal holdpulse is adjusted to T1 by varying the control signal V_Ctrl as described with respect to FIGS. 3, 4A, 4B and 4D. When the signal holdpulse is supplied to the control terminal of the switch S3 in an amplification mode, in which the capacitor C1 is coupled to the inverting input of the operational amplifier OA and the capacitor C2 is coupled between the inverting input and the output Out the operational amplifier OA as described with respect to FIG. 1C, a reference voltage, such as the ground voltage, is applied to the node P of the capacitor C1 during a period corresponding to the pulse width T1 of the signal holdpulse. As a result, the output voltage Vout rises to a corresponding voltage V1 as described with respect to FIG. 2.

At operation 615, the pulse width of the signal holdpulse is measured. For example, the pulse width monitor 130 is configured as a TCC circuit to output the measured pulse width as a current signal, as described with respect to FIG. 1A. In some situations, the accuracy of the pulse width measurement is a consideration. In at least one embodiment, pulse width measurement errors are offset by using the pulse width difference (such as $\Delta T_{13}$ and $\Delta T_{23}$ as described herein), instead of using directly the measured pulse width value. As a result, bandwidth measurement accuracy is improved in at least one embodiment.

At operation 625, the output voltage Vout corresponding to the pulse width of the signal holdpulse is measured. For example, the analyzer 140 obtains the output voltage Vout as described with respect to FIG. 1A.

The operations 605, 615 and 625 are repeated to obtain a sufficient number of measurements. For example, the controller 115 switches the switch-capacitor circuit 110 to the sampling mode to charge the capacitor C1, then adjusts the pulse width of the signal holdpulse from T1 to T2, and supplies the signal holdpulse with the pulse width T2 to the switch-capacitor circuit 110 in the subsequent amplification mode. Operations 615 and 625 are performed to obtain the pulse width T2 and the corresponding voltage V2. The described process is performed at least one more time to obtain the pulse width T3 and the corresponding voltage V3.

At operation 635, the time constant τ of the switch-capacitor circuit is extracted. For example, the time constant τ is derived from the obtained T1, T2, T3 and V1, V2, V3 by solving the equation (5) as described with respect to FIG. 2. The bandwidth of the operational amplifier, e.g., an OTA, is derived from the extracted time constant as 1/τ.

In at least one embodiment, the bandwidth of the operational amplifier OA is derived additionally from the capacitive loading.

Figure 6B:
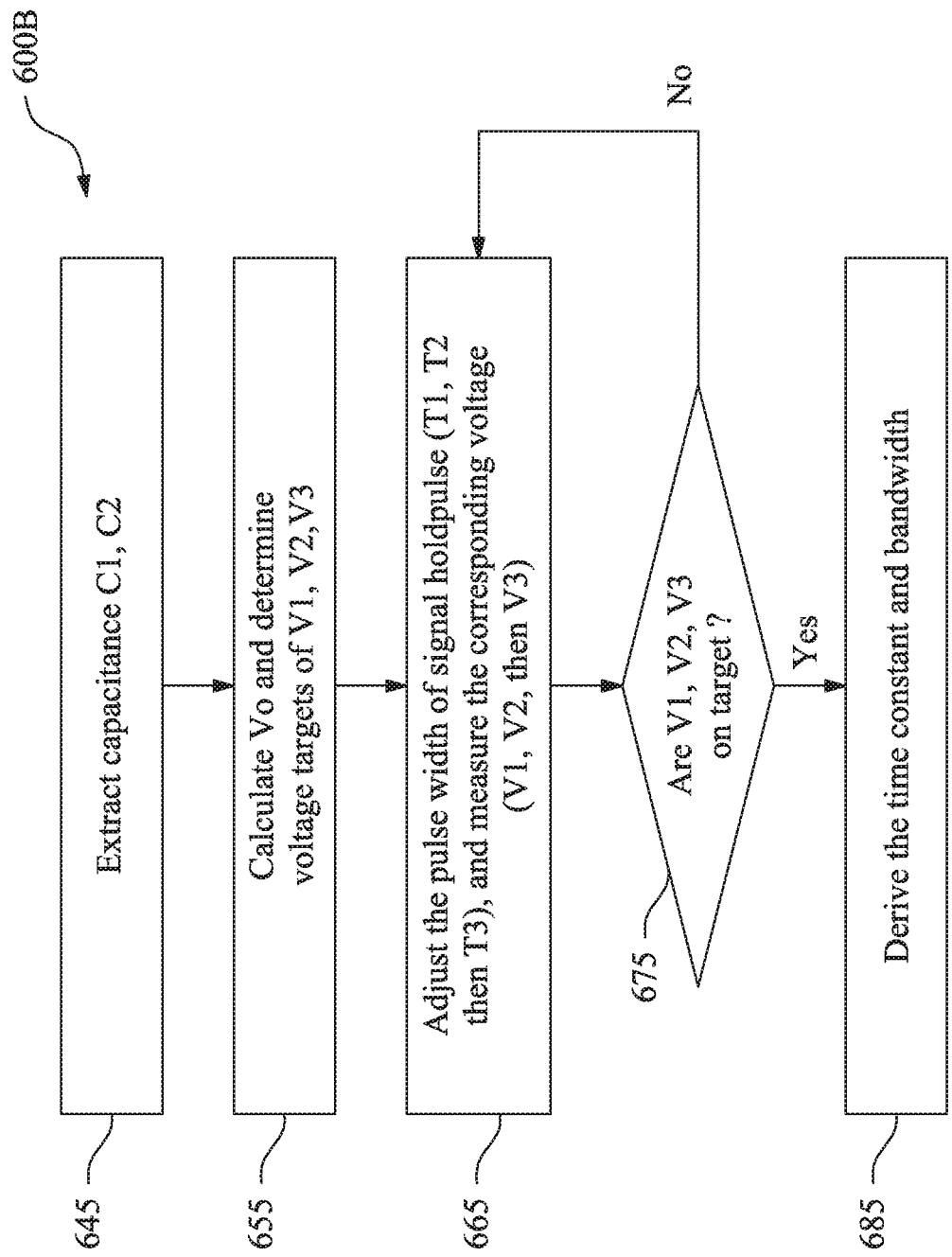
FIG. 6B is a flow chart of a method of bandwidth measurement, in accordance with some embodiments.

FIG. 6B is a flow chart of a method 600B of bandwidth measurement, in accordance with some embodiments. In at least one embodiment, the method 600B is performed by one or more of the bandwidth measurement circuits described herein, under control of a controller, e.g., the controller 115 described herein.

At operation 645, capacitance values of the capacitors C1 and C2 are extracted, and the capacitive loading C1/C2 is determined. In at least one embodiment, the capacitance values of the capacitors C1 and C2 at the design stages are used. However, due to process variations during manufacture, there is a possibility that the actual capacitance values of the capacitors C1 and C2 are different from the capacitance values intended at the design stage. To increase accuracy, the actual capacitance values of the capacitors C1 and C2 are measured in some embodiments. In one or more embodiments, the actual capacitance values of the capacitors C1 and C2 are measured by a CBCM circuit as described herein. In at least one embodiment, the CBCM circuit is arranged on-chip, i.e., on the same die as the operational amplifier OA and the switch-capacitor circuit 110 having the capacitors C1 and C2 to be measured. Compared to other approaches where capacitance values are measured by external testing equipment with high capacitive load of wiring or conductive traces between the external testing equipment and the capacitors to be measured, the on-chip arrangement of the CBCM circuit in accordance with some embodiments further increases the measurement accuracy, by avoiding such high capacitive load of wiring or conductive traces, especially in high speed (i.e., high frequency) applications where the capacitive load of wiring or conductive traces becomes significant as the frequency increases. In at least one embodiment, the capacitance values of the capacitors C1 and C2 are measured once, and stored, e.g., in a memory of the controller 115 for future uses.

At operation 655, the voltage $V_O$ is determined based on the extracted capacitive lading C1/C2. For example, $V_O$ is determined from the relationship $V_O=Vin0*C1/C2$, where the voltage value of Vin0 is known, e.g., Vin0 is the power supply voltage VDD. The target voltages of V1-V3 are determined as fractions or percentages of $V_O$. Example target voltages of the V1-V3 are 99%, 90% and 80% of $V_O$ as described herein. In some embodiments, target voltage ranges are set for V1-V3. For example, V1 is considered on target when V1 falls in a target voltage range from 97% to 99% of $V_O$, V2 is considered on target when V2 falls in a target voltage range from 89% to 91% of $V_O$, and V3 is considered on target when V3 falls in a target voltage range from 79% to 81% of $V_O$.

At operation 665, the pulse width of the signal holdpulse is adjusted, and the corresponding voltage Vout is measured. For example, the control signal V_Ctrl supplied to the adjustable delay circuit 320 is changed to bring the pulse width of the signal holdpulse to a value T1 which causes the corresponding voltage V1 to have the determined target voltage (or to fall in the determined target voltage range).

At operation 675, when the measured value of V1 is not on target, e.g., the measured value of V1 does not match the determined target voltage (or does not fall in the determined target voltage range), the process returns to operation 665 to adjust the pulse width of the signal holdpulse and operation 675 is performed gain. The described process is performed iteratively until the measured value of V1 is on target. The on-target value of V1 and the corresponding measured value of T1 are stored, e.g., in a memory of the controller 115. This process is performed for T2/V2 and T3/V3 until all V1-V3 are on target.

At operation 685, when all V1-V3 are on target, the time constant τ and the corresponding bandwidth of the operational amplifier OA are determined using the on-target values of V1-V3, the corresponding measured values of T1-T3 and the equation (5), as described herein. In some embodiments, the values of the control signal V_Ctrl corresponding to T1-T of the on-target values of V1-V3 are stored, and used for future bandwidth measurements, for example, in accordance with the method 600A described with respect to FIG. 6A.

In some embodiments, the method 600A and/or 600B is/are performed by the controller 115 at predetermined interval, or upon request from external circuitry.

The above method embodiment shows example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing various embodiments.

Figure 7:
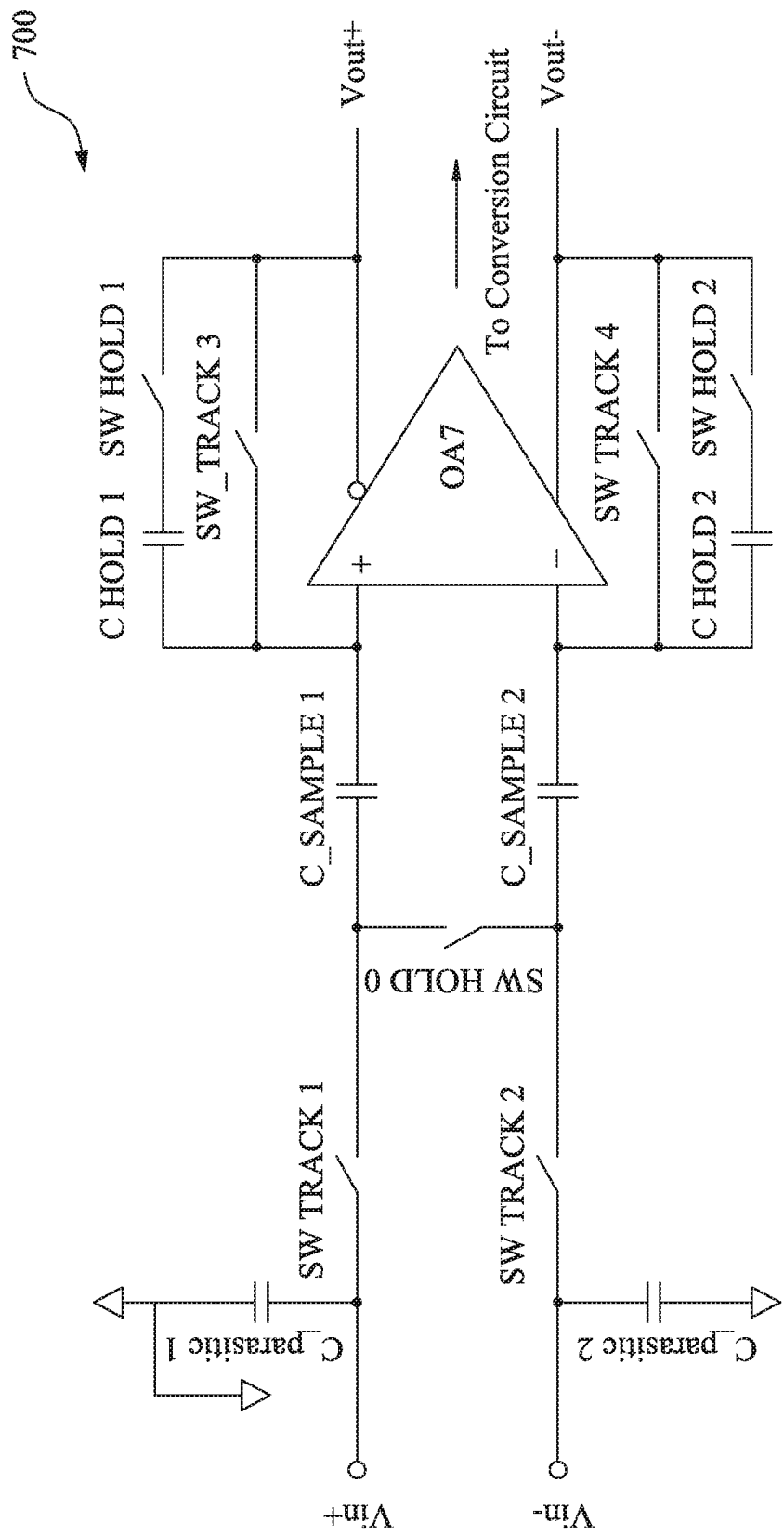
FIG. 7 is a schematic circuit diagram of a bandwidth measurement circuit, in accordance with some embodiments.

FIG. 7 is a schematic circuit diagram of a bandwidth measurement circuit 700, in accordance with some embodiments. The bandwidth measurement circuit 700 comprises a differential operational amplifier OA7, and a switch-capacitor circuit. The switch-capacitor circuit comprises switches SW_Track 1, SW_Track 2, SW_Track 3, SW_Track 4, SW_Hold 0, SW_Hold 1, and SW_Hold 2, and capacitors C_Sample 1, C_Sample 2, C_Hold 1 and C_Hold 2. Capacitors C_paracitic 1 and C_paracitic 2 illustrated in FIG. 7 are parasitic capacitances. The bandwidth measurement circuit 700 further comprises differential inputs Vin+ and Vin−, and differential outputs Vout+ and Vout−. The switches SW_Track 1, SW_Track 2, SW_Track 3, and SW_Track 4 are controlled by the signal sample. The switches SW_Hold 0, SW_Hold 1, and SW_Hold 2 are controlled by the signal holdpulse. The input Vin+, the switch SW_Track 1, the switch SW_Hold 0, the capacitor C_Sample 1, a non-inverting input of the operational amplifier OA7, the capacitor C_Hold 1, the switch SW_Track 3, and the output Vout+ correspond to, and are coupled together in the same manner as, the input In, the switch S1, the switch S3, the capacitor C1, the inverting input of the operational amplifier OA, the capacitor C2, the switch S2 and the output Out described with respect to FIG. 1A, with a difference in that the switch SW_Hold 0 is coupled to a node btw the SW_Track 2 and the C_Sample 1, rather than to the ground. The switch SW_Hold 1 is coupled between the capacitor C_Hold 1 and output Vout+. The input Vin−, the switch SW_Track 2, the switch SW_Hold 0, the capacitor C_Sample 2, an inverting input of the operational amplifier OA7, the capacitor C_Hold 2, the switch SW_Track 4, the output Vout−, and the switch SW_Hold 2 are coupled together in the same manner as the input Vin+, the switch SW_Track 1, the switch SW_Hold 0, the capacitor C_Sample 1, the non-inverting input of the operational amplifier OA7, the capacitor C_Hold 1, the switch SW_Track 3, the output Vout+ and the switch SW_Hold 1. In at least one embodiment, the bandwidth measurement circuit 700 operates in a manner similar to that described with respect to FIGS. 1A-1D, FIG. 2, and FIG. 5. The described configuration and/or operation of the bandwidth measurement circuit 700 is an example. Other arrangements are within the scope of various embodiments.

Figure 8:
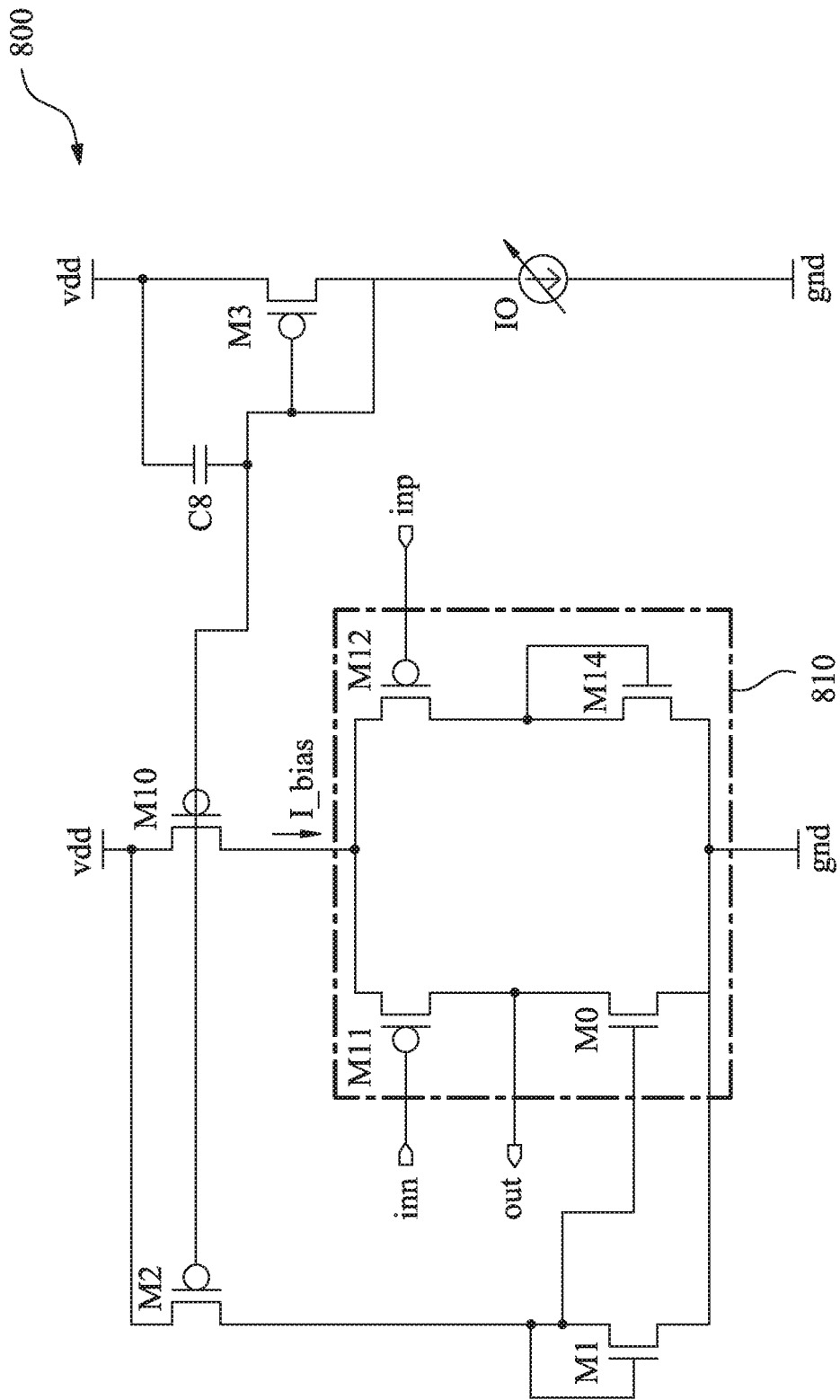
FIG. 8 is a schematic circuit diagram of an amplifier with bias current controlling circuitry, in accordance with some embodiments.

FIG. 8 is a schematic circuit diagram of a circuit 800 having an amplifier and bias current controlling circuitry, in accordance with some embodiments. The circuit 800 comprises transistors M0, M1, M2, M3, M10, M11, M12 and M14, a capacitor C8 and a variable current source I0. The transistors M2, M3, M10, M11 and M12 are PMOS transistors, the transistors M0, M1 and M14 are NMOS transistors. The transistors M0, M11, M12 and M14 are coupled to form an amplifier 810. The amplifier 810 has inputs inn and inp coupled to gates of transistors M11 and M12, and an output out coupled to drains of transistors M0 and M11. Drains of transistors M12 and M14 are coupled to a gate of transistor M14. Transistor M3 and the variable current source I0 are coupled in series between the power supply voltage VDD and the ground voltage. Capacitor C8 is coupled between a source and a gate of transistor M3. Transistors M3, M10 and M2 are coupled to form a current mirror. The current of the variable current source I0 is mirrored by the current mirror to supply a bias current I_bias from transistor M10 to the amplifier 810. The bias current I_bias is varied by the variable current source I0, and adjusts the bandwidth of the amplifier 810 accordingly. Transistors M2 and M1 are coupled in series between the voltage VDD and the ground voltage, to provide a reference sinking current of, e.g., 20% of the bias current I_bias which provides a gate voltage for transistor M0 in the amplifier 810. The described configuration and operation for amplifier bias current adjustment are examples. Other arrangements are within the scope of various embodiments.

In some other approaches, characterization of an amplifier, e.g., an OTA, is not available on analog WAT (wafer acceptance) tests. As a result, RF tests or special active probe tests are performed, involving expensive analyzers. In some other approaches, statistical data collection is a consideration, because bandwidth measurement throughput is low, e.g., 100 MHz or lower. In some other approaches, bandwidth measurements are performed at a lower frequency due to one or more factors, such as large capacitive loading of wiring which is several tens pF, nF or even higher. Some other approaches are not suitable for high frequency applications where capacitive loading is in a range of single digit pF or even smaller, down to a few fF. Some other approaches experience additional uncertainty of capacitive loading from the feedback network, and uses a resistive feedback network to set the circuit operation point. One or more of the described considerations of one or more other approaches is/are overcome or improved by using the bandwidth measurement methodology described with respect to some embodiments herein.

In some embodiments, a switch-capacitor circuit is used to measure the bandwidth of an amplifier, using the signal sample (also referred to as sample clock in some embodiments) and signal holdpulse (also referred to as hold clock in some embodiments) as described herein. A change of the pulse width of the hold clock is used in one or more embodiments to monitor the time constant of the circuit. In at least one embodiment, the pulse width of the hold clock is measured by a TCC. The bandwidth of the amplifier is derived from the time constant. In at least one embodiment, the bandwidth of the amplifier is additionally derived from the capacitive loading which is measured by a CBCM circuit. In at least one embodiment, the bandwidth measuring circuit is arranged on-chip with respect to the amplifier and the switch-capacitor circuit.

As a result, one or more embodiments are applicable to high speed and/or high frequency applications, and directly extract amplifier bandwidths and circuit performance in the range of GHz. In some embodiments, standard WAT test equipment is used, without involving other expensive and/or special testing equipment. Some embodiments directly reflect real time performance at product like applications. In some embodiments, no special equipment is used for small pulse-width and capacitive load extraction. In some embodiments, the on-chip arrangement of the bandwidth measuring circuit provides not only a testing capability during manufacture, but also an on-chip calibration and/or adjustment capability during operation. In some embodiments, the bandwidth adjustment is performed periodically or on demand. An example on-demand adjustment includes increasing the bandwidth to provide high speed performance, and decreasing the bandwidth to save power consumption when high speed performance is not called for.

Embodiments that combine different features and/or different embodiments are within the scope of the disclosure and will be apparent to those of ordinary skill in the art after reviewing various embodiments.

In summary, a circuit and/or method for bandwidth measurement in accordance with some embodiments vary the pulse width of a hold clock in an amplification mode, to obtain various pulse widths and corresponding output voltages. Differences among the various pulse widths and differences among the corresponding output voltages are used to extract a time constant which is further used to determine the bandwidth of the amplifier.

In some embodiments, a circuit for measuring a bandwidth of an amplifier includes a first capacitor, a second capacitor, a first switch, a second switch, a third switch and a pulse generator. The first capacitor has a first terminal coupled to a first input of the amplifier, and a second terminal. The second capacitor has a first terminal coupled to the first input of the amplifier, and a second terminal coupled to a first output of the amplifier. The first switch has a first terminal coupled to a first input node, a second terminal coupled to the second terminal of the first capacitor, and a control terminal. The second switch has a first terminal coupled to the first input of the amplifier, a second terminal coupled to the first output of the amplifier, and a control terminal. The third switch has a first terminal, a second terminal coupled to the second terminal of the first capacitor, and a control terminal. The pulse generator has a first output coupled to the control terminal of the third switch. The pulse generator is configured to vary a pulse width of a first pulse signal supplied from the first output to the control terminal of the third switch.

In some embodiments, circuit for measuring a time constant of an amplifier includes a first capacitor and a first switch coupled in series between an input of the amplifier and an input node, a second capacitor and a second switch coupled in parallel between the input of the amplifier and an output of the amplifier, a third switch coupled between the first capacitor and a reference node, and a pulse generator configured to generate a first pulse signal and a second pulse signal. The first switch is configured to couple the first capacitor to the input node responsive to the first pulse signal, the second switch is configured to couple the output of the amplifier to the first capacitor and the input of the amplifier responsive to the first pulse signal, and the third switch is configured to couple the first capacitor to the reference node responsive to the second pulse signal.

In some embodiments, a method of measuring a time constant of an amplifier includes, using a pulse generator, generating a first pulse signal and a second pulse signal, in response to the first pulse signal, charging a first capacitor to a value of an input voltage, the first capacitor being coupled to an input of the amplifier, in response to the second pulse signal, applying a reference voltage to the first capacitor while a second capacitor is coupled between the input of the amplifier and an output of the amplifier, and measuring a plurality of voltages at the output of the amplifier in response to a corresponding plurality of pulse widths of the second pulse signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit for determining a bandwidth of an amplifier, the circuit comprising:
    a first capacitor having a first terminal coupled to a first input of the amplifier, and a second terminal;
    a second capacitor having a first terminal coupled to the first input of the amplifier, and a second terminal coupled to a first output of the amplifier;
    a first switch having a first terminal coupled to a first input node, a second terminal coupled to the second terminal of the first capacitor, and a control terminal;
    a second switch having a first terminal coupled to the first input of the amplifier, a second terminal coupled to the first output of the amplifier, and a control terminal;
    a third switch having a first terminal coupled to a node, a second terminal coupled to the second terminal of the first capacitor, and a control terminal; and
    a controller coupled to the first output of the amplifier and the control terminals of the first, second and third switches, the controller configured to
        supply a first pulse signal to the control terminals of the first switch and the second switch to close or open the first switch and the second switch, supply a second pulse signal having a varying pulse width to the control terminal of the third switch to close the third switch when the first switch and the second switch are opened, and to open the third switch when the first switch and the second switch are closed, and determine the bandwidth of the amplifier based on the varying pulse width of the second pulse signal and a corresponding varying first output voltage at the first output of the amplifier when the third switch is closed.

2. The circuit of claim 1, further comprising:
a third capacitor having a first terminal coupled to a second input of the amplifier, and a second terminal;
a fourth capacitor having a first terminal coupled to the second input of the amplifier, and a second terminal coupled to a second output of the amplifier;
a fourth switch having a first terminal coupled to a second input node, a second terminal coupled to the second terminal of the third capacitor, and a control terminal;
a fifth switch having a first terminal coupled to the second input of the amplifier, a second terminal coupled to the second output of the amplifier, and a control terminal; and
a sixth switch having a first terminal coupled to the node, a second terminal coupled to the second terminal of the third capacitor, and a control terminal,
wherein the controller is coupled to the second output of the amplifier and the control terminals of the fourth, fifth and sixth switches, the controller configured to
supply the first pulse signal to the control terminals of the fourth switch and the fifth switch to close or open the fourth switch and the fifth switch,
supply the second pulse signal having the varying pulse width to the control terminal of the sixth switch to close the sixth switch when the fourth switch and the fifth switch are opened, and to open the sixth switch when the fourth switch and the fifth switch are closed, and
determine the bandwidth of the amplifier further based on the varying pulse width of the second pulse signal and a corresponding varying second output voltage at the second output of the amplifier when the sixth switch is closed.

3. The circuit of claim 2, wherein
the node to which the first terminal of the third switch and the first terminal of the sixth switch are coupled is a node of a reference voltage.

4. The circuit of claim 1, further comprising:
a third capacitor having a first terminal coupled to a second input of the amplifier, and a second terminal coupled to the node to which the first terminal of the third switch is coupled;
a fourth capacitor having a first terminal coupled to the second input of the amplifier, and a second terminal coupled to a second output of the amplifier;
a fourth switch having a first terminal coupled to a second input node, a second terminal coupled to the second terminal of the third capacitor, and a control terminal; and
a fifth switch having a first terminal coupled to the second input of the amplifier, a second terminal coupled to the second output of the amplifier, and a control terminal,
wherein the controller is coupled to the second output of the amplifier and the control terminals of the fourth and fifth switches, the controller configured to supply the first pulse signal to the control terminals of the fourth switch and the fifth switch to close the fourth switch and the fifth switch when the third switch is opened, and to open the fourth switch and the fifth switch when the third switch is closed, and determine the bandwidth of the amplifier further based on the varying pulse width of the second pulse signal and a corresponding varying second output voltage at the second output of the amplifier when the third switch is closed.

5. The circuit of claim 1, wherein
the node to which the first terminal of the third switch is coupled is a node of a ground voltage.

6. The circuit of claim 1, wherein
the controller comprises a pulse generator which comprises:
a signal source having a first output and a second output, the signal source configured to generate the first pulse signal at the first output; and
an adjustable delay circuit having an input coupled to the second output of the signal source, and an output, the adjustable delay circuit configured to generate the second pulse signal at the output of the adjustable delay circuit.

7. The circuit of claim 6, wherein
the adjustable delay circuit comprises:
a first inverter having an input defining the input of the adjustable delay circuit, and an output;
an adjustable delay unit having an input coupled to the output of the first inverter, and an output;
a second inverter having an input coupled to the output of the adjustable delay unit, and an output; and
an AND gate having a first input coupled to the input of the first inverter, a second input coupled to the output of the second inverter, and an output defining the first output of the output of the adjustable delay circuit.

8. A circuit for determining a time constant of an amplifier, the circuit comprising:
a first capacitor and a first switch coupled in series between an input of the amplifier and an input node;
a second capacitor and a second switch coupled in parallel between the input of the amplifier and an output of the amplifier;
a third switch coupled between the first capacitor and a reference node; and
a controller configured to generate a first pulse signal and a second pulse signal, the second pulse signal having a plurality of pulse widths,
wherein
the first switch is configured to couple the first capacitor to the input node responsive to the first pulse signal,
the second switch is configured to couple the output of the amplifier to the first capacitor and the input of the amplifier responsive to the first pulse signal,
the third switch is configured to couple the first capacitor to the reference node responsive to the second pulse signal, and
the controller is configured to determine the time constant of the amplifier based on the plurality of pulse widths of the second pulse signal and a plurality of corresponding voltage values of an output voltage at the output of the amplifier.

9. The circuit of claim 8, wherein
the controller comprises a pulse generator configured to receive a clock signal at an input, generate the first pulse signal based on the clock signal, the first pulse signal having a first pulse signal phase, and generate a hold signal based on the clock signal, the hold signal having a phase opposite the first pulse signal phase.

10. The circuit of claim 9, wherein
the pulse generator is further configured to
receive a control signal at a control terminal,
apply a hold signal delay in accordance with the control signal, and
generate the second pulse signal having a pulse width based on the hold signal delay.

11. The circuit of claim 10, wherein
the pulse generator comprises an AND gate comprising:
a first input terminal configured to receive the hold signal;
a second input terminal configured to receive a signal having the hold signal delay; and
an output terminal configured to output the second pulse signal.

12. The circuit of claim 11, wherein
the pulse generator further comprises:
a first inverter having an input configured to receive the hold signal, and an output;
an adjustable delay unit having an input coupled to the output of the first inverter, and an output, the adjustable delay unit configured to apply the hold signal delay to the hold signal in accordance with the control signal; and
a second inverter having an input coupled to the output of the adjustable delay unit, and an output coupled to the second input terminal of the AND gate.

13. The circuit of claim 8, wherein
the controller comprises an analyzer circuit configured to measure the output voltage of the amplifier at a falling edge of the second pulse signal.

14. The circuit of claim 8, wherein
the controller comprises a bias current control circuit configured to output a bias current, wherein the amplifier is configured to adjust a bandwidth responsive to the bias current.

15. The circuit of claim 8, wherein
another input of the amplifier and the reference node are configured to have a ground voltage level.

16. The circuit of claim 8, wherein
the amplifier is configured in a differential mode and the reference node is configured to receive a voltage signal.

17. A method of determining a time constant of an amplifier, the method comprising:
using a pulse generator, generating
a first pulse signal having a first phase, and
a second pulse signal having a plurality of pulse widths and a second phase opposite the first phase;
in response to the first pulse signal,
coupling an input of the amplifier to an output of the amplifier, and
charging a first capacitor to a value of an input voltage, the first capacitor being coupled to the input of the amplifier;
in response to the second pulse signal,
coupling a second capacitor between the input of the amplifier and the output of the amplifier, and
applying a reference voltage to the first capacitor while the second capacitor is coupled between the input of the amplifier and the output of the amplifier;
measuring a plurality of output voltages at the output of the amplifier corresponding to the plurality of pulse widths of the second pulse signal; and
determining the time constant of the amplifier based on the plurality of output voltages and the corresponding plurality of pulse widths of the second pulse signal.

18. The method of claim 17, wherein
the charging the first capacitor to the value of the input voltage comprises charging the first capacitor to a power supply voltage.

19. The method of claim 17, wherein
the generating the second pulse signal having the plurality of pulse widths is based on a predetermined range of target voltages.

20. The method of claim 17, further comprising:
adjusting a bandwidth of the amplifier based on the determined time constant.

* * * * *